INVENTORS
WILLIAM H. FOSTER
WALTER F. TACKETT
ALVIN I. MORRISON
BY Harry R. Lubcke
AGENT

MODULATABLE TRANSISTOR OSCILLATOR

Filed May 2, 1958 2 Sheets-Sheet 2

INVENTORS
WILLIAM H. FOSTER
WALTER F. TACKETT
ALVIN I. MORRISON
BY Harry R. Lubcke
AGENT 2,962,670

MODULATABLE TRANSISTOR OSCILLATOR

William H. Foster, West Covena, Walter F. Tackett, Los Angeles, and Alvin I. Morrison, Santa Ana, Calif., assignors to Electronic Engineering Co. of California, Santa Ana, Calif., a corporation of California Filed May 2, 1958, Ser. No. 732,719

11 Claims. (Cl. 332—23)

Our invention relates to an electrical oscillator and particularly to an oscillator of the phase shift type employing transistors and frequency modulatable by varying a resistive element thereof or by impressing a voltage thereon.

In modern technology it is often necessary to measure stress, pressure, acceleration, or similar parameters, or to measure the voltage output from a thermocouple, a photoelectric cell, a solar battery or from an electrically energized mechanically controlled potentiometer. Such measurements are often to be made in rockets, missiles or airplanes and frequently by telemetering, in which latter case the measured values are automatically transmitted to ground over a radio link. Stress, pressure and acceleration are often measured by transducers which produce a resistance variation, while the outputs of the other devices mentioned are a relatively low voltage.

Our device is capable of reproducing the changes in resistance as a change in frequency of an oscillator otherwise stable in frequency and the voltage changes similarly in a slightly different alternate. It may be embodied in a small size and requires only a small amount of electrical energy for operation. It will supply a relatively pure sine wave oscillatory waveform which may be linearly modulated. The electrical output is not affected regardless of severe ambient conditions of temperature, vibration and shock.

The prior art has consisted of multivibrators or other oscillators having an essentially square waveform output. The very high harmonic content of this waveform has made it difficult if not impossible to combine the outputs of several such devices of different frequencies for transmission over a single telemetering channel and to separate these outputs by frequency filtering at the terminal end of the channel. If an attempt is made to alter the essentially square wave to essentially a sine wave, a separate electrical filter must be employed for each oscillator and each of these is larger and heavier than the oscillator it filters.

Briefly, our improved oscillator consists of three pairs of cascade-connected transistors in the common-emitter connection, a pair of push-pull transistors and plural phase shifting elements suitably phased in a feedback type circuit to maintain self-oscillation. An automatic gain control circuit connects from the output to the input of the amplifier to limit the amplitude of oscillation to the linear portion of the characteristic and thereby obtain a pure sine waveform. One secondary of a transformer connects the push-pull transistors to a bridge circuit. For resistance variation modulation of the frequency of oscillation a passive four-arm resistance bridge is employed. For voltage variation modulation of the frequency of oscillation a diode bridge is substituted.

A resistance-capacitance phase shifter connects to another secondary of said transformer and to a resistive additive mixing circuit. This is followed serially by a series resonant circuit. A connection between the inductor and capacitor thereof provides an additional phase shift to in-phase with respect to the input of the transistor amplifier described. The Nyquist criterion for oscillation of the complete circuit is satisfied and so the circuit oscillates.

An object of our invention is to provide a frequency modulatable substantially pure sine wave oscillator for telemeter purposes.

Another object is to provide a transistorized oscillator of small size, light weight and of small power supply requirements.

Another object is to provide a telemeter type oscillator which is capable of precise and stable operation under severe ambient conditions, such as extremes in temperature, vibration, shock and variation of power supply voltage.

Another object is to provide an oscillator that may be frequency modulated by a resistance change or by a voltage change.

Another object is to provide internal calibration means for an oscillator.

Other objects will become apparent upon reading the following detailed specification and upon examining the accompanying drawings, in which are set forth by way of illustration and example certain embodiments of our invention.

Figure 1:
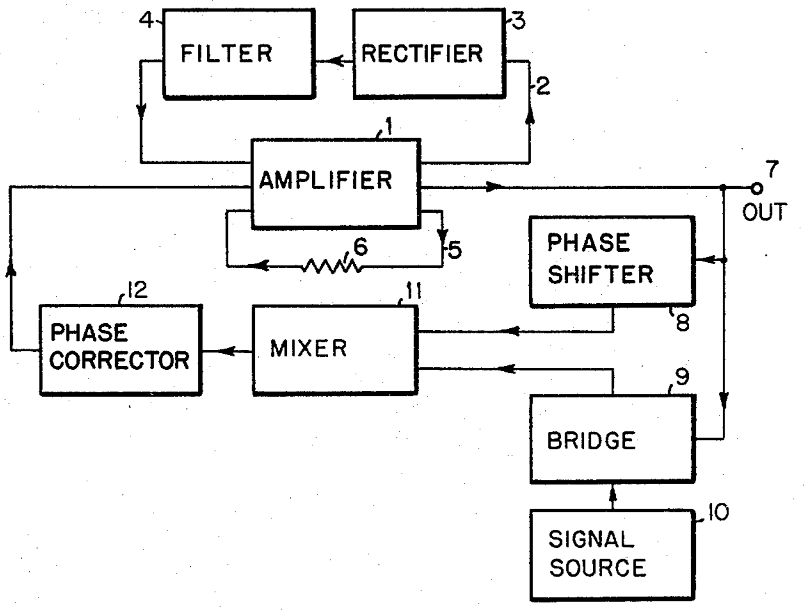
Fig. 1 shows a block diagram of our oscillator.

In Fig. 1 numeral 1 represents a transistor amplifier having plural pairs of cascade-connected common-emitter transistors followed by a push-pull connected pair of transistors as the output stage. Loop 2 is the direct current or automatic gain control feedback circuit. It includes rectifier 3 and filter 4. Loop 5 is the alternating current or stabilizing feedback circuit. It includes resistor 6. Terminal 7 is the frequency modulated output terminal of the oscillator. It is connected to the output of amplifier 1.

Also connected to the output of the amplifier is a resistance-capacitance phase shifter 8 and equivalently in parallel a bridge 9. For a strain gage or equivalent variable resistance transducer this is composed of passive resistors with the transducer in one or more arms. For a voltage controlled oscillator the bridge is one of diodes. A signal source 10 coacts with the bridge, either by altering the resistance of the bridge or by supplying a signal voltage thereto.

A fixed phase shift signal from shifter 8 is combined with an in-phase variable amplitude signal from bridge 9 in additive mixer 11 to cause a variable phase shift signal output from mixer 11. The output is applied to phase corrector 12.

The phase shift out of mixer 11 is of the order of 90 degrees. A total phase shift of 180 degrees is required to maintain oscillation; amplifier 1 being constituted to have an output phase 180 degrees out of phase from the input. Accordingly, a reactive phase corrector 12 is connected between the mixer and the input of the amplifier to complete the oscillatory path.

Figure 2:
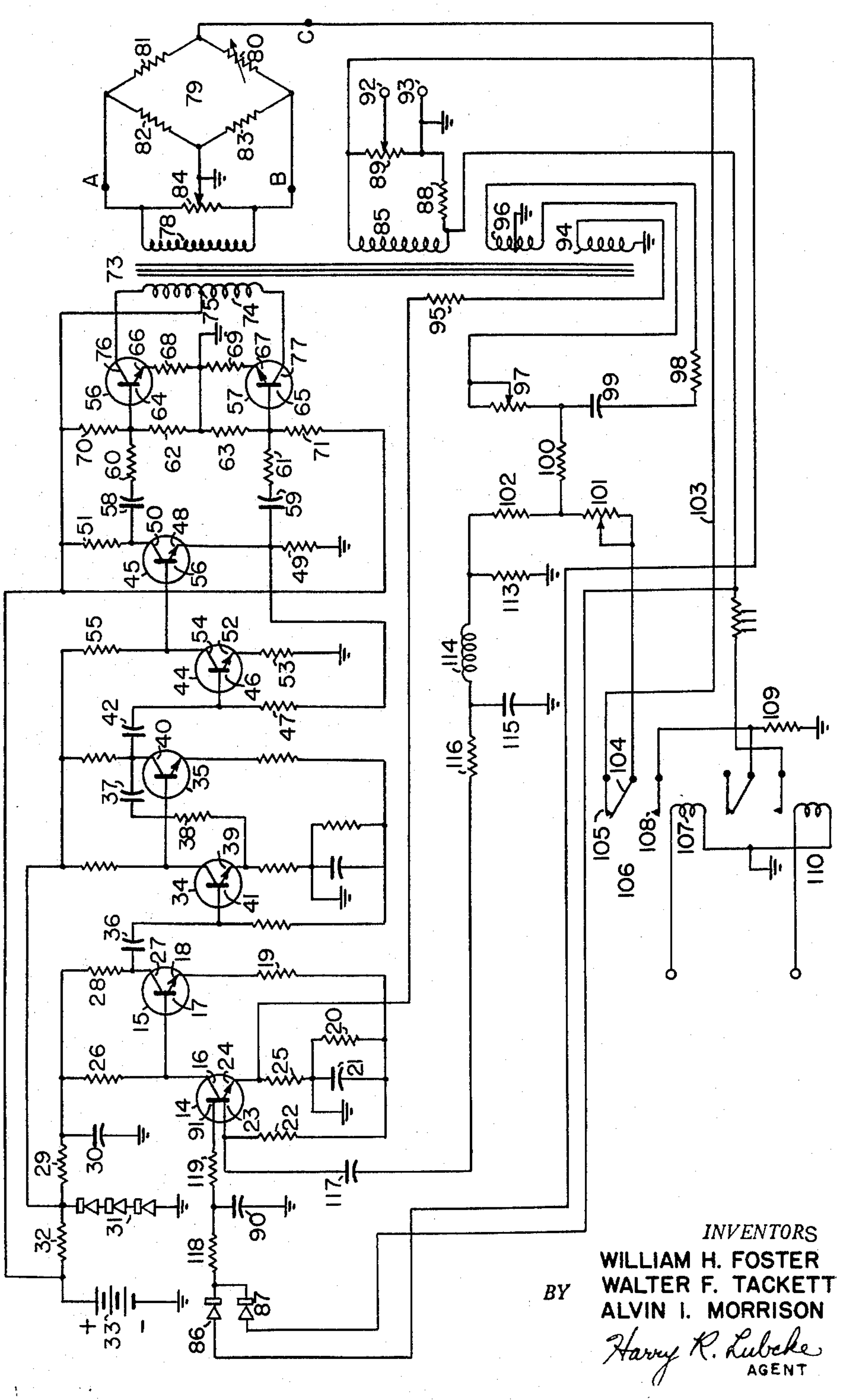
Fig. 2 shows a schematic diagram of a resistance bridge embodiment of the same.

The several entities of Fig. 1 are detailed in the schematic diagram of Fig. 2. We prefer to employ silicon transistors and diodes throughout our device so that the advantage of operation at relatively high temperatures may be obtained. The first transistor 14 is a tetrode of the NPN type and accomplishes the automatic gain control function in coaction with a rectifier and a filter to be described later. In addition, it constitutes the first of the first pair of cascade-connected transistors of the amplifier.

The second transistor 15 of the first pair is direct connected to the first transistor. Both are common-emitter connected and the collector 16 of the first transistor connects to the base 17 of the second. Bias to the first transistor 14 is supplied from the emitter current of second transistor 15. This is accomplished by connecting second emitter 18 through two resistors 19 and 20 in series to signal ground. The former has a resistance of a few hundred ohms and the latter a resistance of the order of ten thousand ohms. This arrangement we have found highly desirable in that the pair are relatively self-compensating for drift due to ambient temperature changes. Resistor 20 is bypassed by capacitor 21 of a few microfarads' capacitance. Because of the low operating voltage of the transistors this capacitor is of small physical size. The junction between resistors 19 and 20 is connected through resistor 22 to base one, numeral 23, of transistor 14 to apply the bias mentioned thereto. The return phase-processed oscillating energy is also impressed on this base to close the loop of the oscillator. The emitter 24 of transistor 14 is connected to ground through resistor 25. Resistor 22 has a resistance of many thousands of ohms while resistor 25 has a resistance of a few hundred ohms.

Collector 16 of transistor 14 is connected to a source of positive supply voltage through resistor 26 and collector 27 of transistor 15 is similarly connected through resistor 28. Both of these resistors have a resistance of approximately ten thousand ohms.

We have achieved enhanced operating stability in the amplifier by decoupling the first two stages and voltage regulating the voltage supply to the first five transistor stages. The decoupling is accomplished by resistor 29 of ten thousand ohms resistance and capacitor 30 of a few microfarads capacitance. The voltage regulation is accomplished by a series string 31 of three Zener diodes and an isolating resistor 32 for the same having a resistance of the order of a thousand ohms. Battery 33 is the prime source of electrical energy supply and may have a voltage of 28 volts. For such a voltage a convenient Zener voltage for each of the diodes 31 is 6 volts, giving a gross supply voltage to the first five transistors of the amplifier of 18 volts.

The first pair of transistors are coupled to the next pair 34, 35 by a coupling capacitor 36 having a capacitance in excess of one microfarad. This capacitor connects from collector 27 of transistor 15 to the base 41 of transistor 34. The second pair of transistors and the circuit connected thereto are the same as the first pair save that both transistors are of the usual triode NPN silicon type, the voltage supply is directly from the regulated terminal of the Zener diodes, and an additional capacitor 37 and resistor 38 connect between the emitter 39 of transistor 34 and the collector 40 of transistor 35.

The latter is a negative feedback circuit that enhances the stability of the transistor pair with respect to ambient temperature from the standpoint of alternating current gain. This circuit also increases the linearity of the amplitude characteristic of the transistor pair.

The third pair of transistors 44 and 45 are similarly constituted and connected as were the second pair except that transistor 45 is a phase-splitting stage and supplies a push-pull output. The collector 40 of transistor 35 is connected through capacitor 42 having a capacitance in excess of one microfarad to the base 46 of transistor 44. A D.C. bias is impressed upon this base through resistor 47, which resistor has a resistance of the order of fifty thousand ohms. This bias originates from emitter 48 current flowing through resistor 49 to ground. Resistor 49 has a resistance of five thousand ohms.

In order that the opposite polarities of signal be developed in the circuit of transistor 45 the collector thereof 50 is connected to a resistor 51, which resistor has a resistance equal to that of resistor 49. Completing the circuit of this pair, emitter 52 of transistor 44 is connected to ground through resistor 53 of a few hundred ohms' resistance and collector 54 of transistor 44 is connected to the ungrounded end of the string of Zener diodes 31 through resistor 55, which has a resistance of ten thousand ohms. Collector 54 is also direct connected to base 56 of transistor 45.

The push-pull signal from transistor 45 is conveyed to push-pull transistors 56, 57 via equal capacitors 58, 59, each having a capacitance in excess of one microfarad. Series resistors 60, 61 feed the push-pull transistors and isolate the prior stage therefrom. These resistors have an approximately equal resistance value of the order of two thousand ohms each, which value may be adjusted, one with respect to the other, to provide a proper driving signal balance. A signal circuit voltage-divider is formed between these resistors and adjacent resistors 62, 63, which latter connect between the bases and ground of the push-pull transistor circuit. Resistor 62 connects between base 64 of transistor 56 and ground and resistor 63 connects between base 65 of transistor 57 and ground. The resistance of each of resistors 62, 63 is somewhat less than that of each of resistors 60 and 61.

Transistors 56, 57 are of somewhat greater power capability than the previously mentioned transistors and still of the NPN silicon type. The emitters thereof, 66, 67, are connected to ground through resistors 68, 69, of equal resistance value of somewhat more than one hundred ohms each. A positive bias of approximately one-tenth of the full voltage of battery 33 is impressed upon each of these bases 64 and 65 by virtue of the connection of resistors 70, 71 to the positive terminal of the battery, and to bases 64, 65, respectively. Each of resistors 70, 71 have a resistance of approximately twenty thousand ohms.

Inductive coupling means, or transformer 73, serve to connect the output of the amplifier to various phasing, load and feedback circuits by means of a plurality of four secondaries. The primary 74 is connected to collector 76 of transistor 56 and to collector 77 of transistor 57. A center tap on the primary connects directly to the positive terminal of battery 33, and so supplies power to the collectors of the push-pull stage. Although the transformer has a number of windings it is of the small toroidal type with an overall diameter of the order of an inch, has a ribbon core and has satisfactory audio frequency characteristics.

Secondary 78 is wound to an impedance of a few hundred ohms and connects to the modulation input. In the variable resistance type of transducer previously mentioned this is a resistance bridge 79. In the illustrative embodiment shown resistor 80 is the strain gage per se. Resistors 81, 82, 83 have a resistance of the same order as the variable resistor element 80; i.e., usually in the range of from one hundred to five hundred ohms. The resistances are chosen so that the bridge is balanced for the normal or zero signal resistance of the variable arm and variations of resistance of the variable arm from that value give the corresponding frequency modulation of the oscillator from its center or resting frequency.

The junction between resistors 81 and 82 is connected to one end of the winding of secondary 78 and the junction between resistors 80 and 83 is connected to the other end of the winding. A potentiometer 84 is also connected across the ends of secondary 78. The resistance of the potentiometer is several thousand ohms and the variable arm thereof is connected to ground and to the bridge junction between resistors 82 and 83. Adjustment of this arm serves to balance the bridge for a desired resting or zero signal condition. The opposite junction, between resistors 80 and 81, constitutes the modulation signal lead. This connects to the mixer to be later described.

Separate secondary 85 serves as the means for originating automatic gain control signals and also as the output circuit for the device from which the frequency modulated output is taken. Its impedance is a few thousand ohms.

Discussing the gain control aspect first, connections from the extremities of secondary 85 pass to oppositely poled silicon diodes 86, 87. The secondary is shunted by two resistors in series, fixed resistor 88 and all of potentiometer 89, with the junction between the two grounded. With such connections full wave rectification of the signal is accomplished by the diodes. The total resistance of the potentiometer is equal to the resistance of the resistor and each is of the order of two thousand ohms.

A series-resistor shunt-capacitor filter is connected to the junction of the diodes opposite to that connecting to the secondary. This reduces the rectified signal energy to a direct voltage which varies only when the amplitude of the signal through the amplifier changes. This voltage has an amplitude of a few volts. Resistors 118 and 119 have a resistance of the order of twenty thousand ohms each and capacitor 90 a capacitance of twenty microfarads.

The resulting control potential is impressed upon second base 91 of tetrode transistor 14. The second base voltage vs. output current characteristic is not linear in this transistor. The transformer secondary is poled so as to cause low amplification of the round-robin signal impressed upon base 23 of transistor 14 when the output from secondary 85 is large and vice versa. In this way the output is maintained approximately constant and linear regardless of changes of electrical characteristics in the whole device of considerable magnitude. Excessive changes caused by a near failure of a component, etc. may be so great as to pass beyond the control capabilities of the automatic gain control circuit, but such changes are not intended to be controlled. The principal control desired is that sufficient to limit the oscillatory signal energy through the amplifier to the linear portion of the amplifier characteristic. In this way we obtain a nearly pure sine waveform; i.e., containing approximately 1% harmonics, in contrast to the near square waveform of the prior art, in which the harmonic content is approximately 40%.

The output from the device is taken from between the variable arm of potentiometer 89 and ground, at output terminals 92, 93.

An over-all A.C. negative feedback has also been provided to contribute to the stability of the electrical characteristics of our device under variable ambient conditions. This is taken from transformer 73 by separate secondary 94, one end of which is grounded and the other is connected to isolating resistor 95. This has a resistance of the order of twenty thousand ohms and may be varied either in manufacturing test or be made a variable resistor to set the degree of feedback required. The opposite end of resistor 95 is connected to the emitter of transistor 14 and is thus impressed upon the input of the amplifier. The polarity of the secondary is such, of course, as to contribute an A.C. negative feedback signal in the emitter circuit. The impedance of secondary winding 94 is approximately ten ohms.

We now turn to the portion of the oscillator which completes the main oscillatory loop and to those components which accomplish the frequency modulation of this energy.

A fourth secondary of transformer 73; i.e., secondary 96, is provided with a grounded center tap and has an impedance of several hundred ohms. One terminal thereof is connected to a rheostat-connected potentiometer 97. The other terminal is connected to a thermistor resistor 98, having a 25° C. resistance of the order of three hundred ohms and a negative temperature coefficient, that is, a reduction of resistance with an increase in temperature. The purpose of the thermistor is to temperature compensate elements 97, 99, 114 and 115 so that the oscillator center frequency shall not change with change in ambient temperature. Capacitor 99 has a capacitance of the order of a few thousand micromicrofarads, depending upon the center frequency chosen, while resistor 97 has a maximum resistance of ten thousand ohms. The center junction between these series-connected elements gives a phase shift of some ninety degrees. Because phase here is frequency of oscillation as interpreted elsewhere in the circuit, the adjustment of resistor 97 acts as a vernier frequency control for altering the resting frequency of the oscillator over several percent thereof, in order to bring the oscillation frequency to a particular standard or desired frequency. For multifrequency operation of several oscillators the several desired frequencies are approximately set by variation of the capacitance of capacitors 99 and 115 in manufacture or in servicing.

Connected to the previously mentioned center junction is resistor 100, having a resistance of ten thousand ohms, for isolation. The opposite terminal of resistor 100 connects to the junction between rheostat-connected potentiometer 101 and resistor 102. In essence, the unbalance signal from bridge 79 is connected by conductor 103 to the end of potentiometer 101 opposite to the connection of resistor 100 in order that frequency modulation of the oscillator be accomplished. Specifically, this connection is made through arm 104 and contact 105 of relay 106. This is the normally closed position for these relay contacts. When relay coil 107 is energized by passing an electric current through it from external means not shown, arm 104 connects to contact 108. This latter contact is connected to a precision resistor 109, which in turn is connected to signal ground. Resistor 109 has a value equal to the resistance of bridge 79 when this is balanced as seen from conductor 103. This is some value between one and five hundred ohms depending upon the particular bridge. Substituting resistor 109 gives a no signal equivalent to a balanced bridge condition. This gives an accurate and independent check of the normal center frequency of the oscillator and conveniently establishes an operational parameter for initial calibration or for reference calibration while in actual use.

In a similar manner, relay 110, when actuated in unison with relay 106, places resistor 111 in series with resistor 109 in combination with transformer secondary 85, which latter furnishes an in-phase modulation signal equivalent to a multiple of that put out by bridge 79 for a prescribed unbalanced condition. The value of resistor 111 is such as to correspond to the signal of bridge 79 when a particular value of modulation obtains, such as 0.8 full modulation. A second operational parameter for initial calibration or for reference calibration while in actual use is established.

We pass now to the phase corrector portion of the oscillator. Resistor 113 establishes a constant load impedance for the phase shifter and a constant source impedance for the phase corrector. It has a value of a few hundred ohms. Inductor 114 and capacitor 115 form the phase corrector per se, being connected serially to ground from the ungrounded end of resistor 113, which in turn connects to resistor 102. The inductor and capacitor are of such characteristics as to form a series resonant circuit which is resonant to the approximate center frequency of the oscillator.

When bridge 79 is unbalanced a certain proportion of the oscillatory signal present at the bridge feeds through and enters the mixer through conductor 103. The amplitude of this signal is proportional to the unbalance of the bridge. This is of the same frequency but of approximately 90° difference in phase than the signal which has passed through the phase shifter 97, 99. The sum of the two signals appears at the junction of resistors 100 and 101. This addition causes the phase shift through both the phase shifter and the phase corrector to be more or less than exactly 180°. This is not the condition for optimum feedback, and so, lacking other restraint, the frequency around the closed regenerative loop changes to an adjacent one at which the over-all phase shift is exactly 180°. In an initial center frequency condition, for instance, the phase shift in the phase shifter was set for exactly 90° when that in the phase corrector was also exactly 90°. With the new conditions the combined phase shift in the phase shifter and the mixer may be 92° and so the phase at the junction of the inductor and capacitor of the phase corrector becomes 88°, which is off frequency for that resonant circuit. Obviously, frequency modulation has been accomplished.

The output at the junction of the inductor 114 and capacitor 115 is connected to resistor 116 for isolation and through coupling capacitor 117 to the first base 23 of transistor 14 to complete the round robin oscillatory circuit. Resistor 116 has a resistance in the order of 100,000 ohms and capacitor 117 a capacitance in excess of one microfarad.

Information to be telemetered often arises as a voltage rather than as a change in resistance. Such a voltage arises from a thermocouple, a photoelectric cell, a solar battery or from an electrically-energized mechanically controlled potentiometer. These are in contrast to the typical change in resistance of the strain gage. By a slight modification of the input portion of the circuit of our previously described oscillator it is possible to frequency modulate it proportional to a voltage rather than to a change in resistance.

In Fig. 2 the letters A, B and C are noted at the right hand side of the circuit. Corresponding letters are found in Fig. 3. The resistor bridge 79 in Fig. 2 is frequently external to the oscillator proper, being within the strain gage package upon the member under test. Accordingly, when change of voltage rather than change of resistance is to modulate the oscillator, the elements of Fig. 3 are substituted at A, B and C rather than those shown to the right thereof in Fig. 2.

Figure 3:
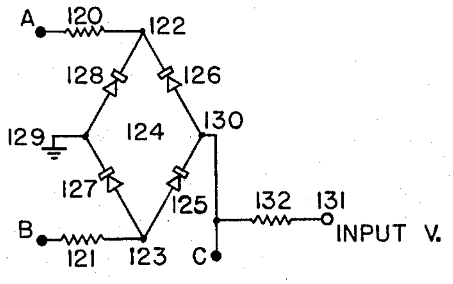
Fig. 3 shows a fragmentary schematic diagram of a voltage controlled embodiment of the same.

In Fig. 3 resistors 120 and 121 are of equal value and are in the range of a few hundred ohms. These connect from the terminals of transformer secondary 78 to opposite junctions 122, 123 of diode bridge 124, and isolate the transformer from the very low impedances which occur at the bridge during conduction. Considering junctions 123 to 122, four preferably silicon diodes 125, 126, 127, 128 are connected in a bridge configuration with all the diodes in the same polarity. When the alternating voltage of the oscillator has the instantaneous polarity of positive at junction 122 and negative at junction 123 the impedance of the bridge is high, since all the diodes are back-biased and do not conduct. When the opposite instantaneous polarity occurs the impedance of the bridge is low, because all diodes do conduct.

At the opposite junctions of the bridge, 129, 130, it is noted that the former junction is grounded and that the latter connects to terminal C. The input signal voltage is fed in at terminal 131 with respect to ground. Resistor 132, in series with the input, is chosen to have a high resistance compared to the resistance of the bridge during conduction and a low resistance compared to that of the bridge during non-conduction. Resistor 132 has a resistance of the order of a few thousand ohms.

The operation of this circuit is as follows. With the first mentioned polarity of oscillator signal from the transformer secondary the bridge impedance is high and so the voltage existing at terminal C is a fraction of that of the input voltage at terminal 131, the value of the fraction depending upon the adjustment of rheostat-connected potentiometer 101 in Fig. 2. The input voltage is often a more or less slowly changing direct voltage, varying in time in a gradual manner as the temperature measured by a thermocouple or the radiation incident upon a sun battery slowly changes. A half cycle later of the oscillator signal, however, the bridge 124 is in conduction and has a very low effective impedance. This shorts junction 130 through this low impedance to ground; i.e., as at 129. Junction 130 connects directly to terminal C, thus the voltage thereat is essentially zero regardless of what voltage may still exist at input terminal 131. Thus, an in-phase approximately square wave of voltage is developed at terminal C having a maximum amplitude and polarity directly proportional to the input signal voltage and a minimum amplitude of zero or ground potential.

Terminal C connects directly to the mixer entity of our device via conductor 103, in Fig. 2. The above-described modulating voltage at oscillator frequency is thus impressed at the mixer. Because this voltage has not encountered a phase shift, as has equivalent oscillator energy which passes through phase shifter 97, 99, the two voltages add to give a phase shift out of the mixer different than the approximate 90° no signal shift obtained at resting oscillatory frequency. In the same manner as has been described, the frequency of oscillation shifts until the phase contribution of the phase corrector 114, 115 causes the over-all shift to be 180° from output to input of the amplifier portion.

Harmonics generated in the chopping process carried on by the diode bridge do not persist in the oscillatory circuit because the resonant nature of the phase corrector quite completely removes them.

Embodiments of both the resistance controlled and the voltage controlled oscillators described have given high quality performance in telemetering and similar applications. Any of the so-called RDB/FM standard frequencies may be employed as an operating frequency by an embodiment having suitable frequency-determining values, over the range of these frequencies from three hundred to twenty-five thousand cycles. A strictly linear frequency modulation of plus or minus 7½% is obtained at the lower frequencies in the range mentioned, while the same to plus or minus 15% may be obtained at the higher frequencies. This linearity is within 1% in the ranges mentioned and for a variation of 1% in strain and correspondingly in resistance a full 7½% of frequency modulation is obtained. Greater percentage of modulation is also possible, as up to 40%, for greater variation of input resistance or voltage, but at decreased linearity for the higher modulation levels.

Embodiments of our oscillator occupy approximately only 3½ cubic inches and weigh 8 ounces. The total power required to operate the oscillator is less than 500 milliwatts for usual embodiments and usual operation has been obtained from special embodiments which require only 50 milliwatts of power. Furthermore, a variation of power supply voltage of plus or minus 20% causes a deviation of less than plus or minus 1% of the bandwidth. After a few minutes warm-up the center frequency drift is less than plus or minus 1% of bandwidth over a two hour period. In the voltage controlled embodiment an input voltage of plus or minus 50 millivolts yields a full 15% bandwidth deviation with a linearity of plus or minus 1% of bandwidth. Still other embodiments have been constructed in which the 15% deviation has been obtained for a 25 millivolt input. The output is typically one volt root-mean-square across a 2,500 ohm load. Embodiments function with the precision described over a range of ambient temperatures of from minus 50 to plus 100 degrees centigrade. Were higher temperature rated capacitors available, this range would be extended to plus 150 degrees centigrade.

A shock of 20 *g* (twenty times the acceleration due to gravity) or vibration at 2,000 cycles at an acceleration of 10 *g* causes a spurious modulation of the center or resting frequency of 1% or less of the bandwidth.

The internally generated noise produced in our oscillator is insignificant.

In view of the precise functioning of embodiments of our oscillator under extreme ambient conditions and because of the small size and light weight thereof it is evident to one skilled in the art that our invention is very well suited for use in rockets, missiles and similar environments. Because of the capability of operating with small input voltages it is also capable of operating with input devices that are generally considered current control devices rather than voltage control devices. Furthermore, the desirable electrical characteristics of our device make it suitable for measurements in the fields of thermodynamics, spectroscopy and mechanics, whether airborne or laboratory application is required.

The described grouping of transistors in circuit pairs allows interchangeability of transistors. A considerable departure in the characteristics of a particular transistor from the average or preferred characteristics does not preclude its use in our device.

Attention is also called to the mode of calibrating our oscillator. This is accomplished by comparing the relative values between two signals as a ratio rather than relying upon the absolute value of any one parameter. In this way, variations of power supply voltage, gain of the amplifier, or similar variations do not affect the calibration signal produced to indicate the true center frequency and the true degree of deviation. The ratio is taken between the feedback occurring in the circuit and either a bridge balance or bridge unbalance condition separately impressed by precision resistor elements.

A maximum frequency of operation of 25,000 cycles has been mentioned but an upper frequency limit of 100,000 cycles is easily obtained with circuit elements of present perfection. Also, while resistive and voltage-originating transducers have been specifically mentioned it will be understood that capacitative and inductive transducers effective in bridge circuit 79 may be used. The frequency modulation produced in the oscillator may then be other than a linear function of the variable measured, but this may be either acceptable or desired.

Silicon NPN transistors have been mentioned. PNP transistors may be employed instead by reversing the polarity of battery 33, Zener diodes 31, and any other polarized components. Germanium transistors may also be used. With germanium the upper temperature limit is decreased.

While elements 114 and 115 have been properly referred to as a series resonant circuit it will be recognized that these elements in combination with input and output resistors also present form a low pass filter. Since the prime function of these elements is to cause a given phase shift from input to output, other combinations such as resistive-capacitative and resistive-inductive may be employed to accomplish the same end.

Specific values of resistance, capacitance and inductance have been given herein, as well as particular performance characteristics and ranges of operability. This has been done to most specifically and accurately teach our invention and how it may be practiced. However, relatively wide departures may be taken from these values of illustrative embodiments without departing from the nature and performance characteristic of our invention.

Variations may also be made in the circuit connections between the elements and any reference to size, weight or other physical characteristics of the embodiments described is subject to wide variation under our invention.

Having thus fully described our invention and the manner in which it is to be practiced, we claim:

1. A feedback frequency-modulatable oscillator comprising an amplifier having a first transistor, another transistor, and an output, a passive bridge and non-inductive phase-shift means in parallel connected to the output of said amplifier, further tapped reactive phase-shift means connected to said phase-shift means to alter the frequency of oscillation of said oscillator upon a change of electrical energy from said bridge; the tap of said further phase-shift means separately connected to an input of said first transistor to complete the feelback path of said oscillator; and resistive means selectively substitutional for said bridge for calibrating said oscillator.

2. An oscillator modulatable by alteration of positive feedback phase in a path comprising a plural-transistor amplifier having an input and an output, a passive bridge connected across the output of said amplifier, non-inductive phase shift means connected in parallel to said bridge in said path, and series-resonant frequency-sensitive phase shift means connected to said phase shift means to alter the frequency of oscillation of said oscillator upon a change of oscillation energy from said bridge, said frequency-sensitive means separately connected in part to the input of said amplifier to complete the positive feedback path of said oscillator.

3. An oscillator frequency modulatable by change of positive feedback phase comprising an amplifier having more than one phase reversal and an output, a bridge connected to the output of said amplifier, phase-shift means connected in parallel to said bridge, and a series resonant phase-shift means connected to said phase shift means to change the frequency of oscillation of said oscillator upon a change of amplitude of oscillation energy from said bridge, said series resonant phase-shift means connected to said phase-shift means and in part to said amplifier to complete the positive feedback path of said oscillator.

4. An oscillator having a loop connection to maintain oscillation which includes one plural-stage amplifier, coupling means connected thereto, a bridge and a phase-shifter parallel connected to said coupling means, an additive mixer also connected to said bridge and phase shifter and in series in said loop, a phase-corrector and an automatic gain control; said automatic gain control connected between said coupling means and said amplifier to limit the amplitude of oscillation, said bridge constituted and connected in said loop to frequency modulate said oscillation according to an electrical status impressed upon said bridge, said phase-shifter constituted and connected in said loop to quadrature shift the phase of said oscillation and said phase-corrector constituted and connected in said loop to quadrature shift the phase of said oscillation to sustain oscillation around said loop at a frequency for said oscillation which corresponds to the electrical status of said bridge.

5. A frequency-modulatable sine wave oscillator having a positive feedback connection to maintain oscillation which includes one plural-transistor transistorized amplifier having a control input and an output, inductive coupling means connected thereto to said output, an electrical bridge and a phase-shifter connected together in shunt and to said coupling means, an additive mixer also connected to said bridge and to said phase shifter, a phase-corrector and an automatic gain control; said automatic gain control connected between said coupling means and a control input of said amplifier to limit the amplitude of oscillation within said amplifier, said bridge coactive with said mixer to frequency modulate said oscillation according to an electrical condition impressed upon said bridge, said phase-shifter in said positive feedback connection coactive to shift the phase of said oscillation approximately ninety electrical degrees and said phase-corrector reactively constituted to shift the phase of said oscillation approximately ninety degrees further at a frequency of said oscillation corresponding to said electrical condition impressed upon said bridge.

6. A modulatable sine waveform oscillator having an electrical feedback loop to maintain oscillation which includes; one multistage transistorized amplifier having a first transistor and an output, inductive coupling means connected to the output of said amplifier, a non-reactive bridge and a phase-shifter connected in parallel and to said coupling means, an additive mixing circuit also connected to said bridge and to said phase-shifter within said loop, a phase-corrector and an automatic gain control; said automatic gain control separately connected between said coupling means and an input electrode of the first transistor of said amplifier to limit the amplitude of oscillation to the linear characteristic of said amplifier, said bridge coactive with said mixing circuit to frequency modulate said oscillation according to the variation of electrical condition impressed upon said bridge, said phase-shifter coactive in said feedback loop to shift the phase of said oscillation approximately ninety electrical degrees and said phase-corrector connected in said feedback loop between said mixing circuit and said amplifier, and reactively constituted to shift the phase of said oscillation to one hundred eighty degrees at a frequency for said oscillation corresponding to said electrical condition impressed upon said bridge.

7. An oscillator comprising a plural transistor amplifier having an input and an output, a bridge, a single transformer having plural windings, two said transformer windings connected between the output of said amplifier and said bridge, a negative feedback connection from another winding of said transformer to the input of said amplifier, a phase shifter connected to still another winding of said transformer, an automatic gain control connected between a further winding of said transformer and an input control of said amplifier, a resistive network, said bridge and said phase shifter connected in parallel and to said network, a reactive circuit series resonant to the frequency of oscillation of said oscillator connected for approximately quadrature phase shift between said resistive network and said amplifier; the amplitude of oscillation of said oscillator limited by action of said gain control and the frequency of said oscillation altered by alteration of an electrical parameter associated with said bridge.

8. A modulatable sine wave oscillator comprising plural pairs of cascade-connected transistors composing an amplifier having an output, a transistor of said amplifier having an input circuit constituted to effect gain control of said amplifier, a pair of transistors push-pull connected to the output of said amplifier, an electrical bridge, a transformer having plural secondaries, said transformer connected between said push-pull transistors and said bridge, a negative feedback from a separate secondary said transformer to said amplifier by separate conductive means, a non-inductive phase shifter connected to another separate secondary of said transformer, automatic gain control means connected from another separate secondary of said transformer to said input circuit of said a transistor, a non-reactive network, said bridge and said phase shifter parallel connected between separate secondaries of said transformer and said network, a reactive low pass filter resonant at the frequency of oscillation of said oscillator series connected to alter the phase of the oscillations to an in-phase condition with respect to the phase of the signal at the input of said amplifier, said filter connected to said network and in part to the input of said amplifier; the recited elements composing an oscillator of limited amplitude of oscillation to a sine wave by action of said gain control and coactive with said bridge such that the frequency of operation of said oscillator is dependent upon the electrical operation of said bridge.

9. A frequency-modulatable sine wave oscillator comprising more than two pairs of common-emitter connected transistors composing an amplifier having an output circuit, the first transistor of the first pair having an input electrode for controlling the gain of said amplifier, another pair of common-emitter transistors push-pull and connected to the output circuit of said amplifier, a non-reactive bridge, a transformer having windings, said transformer windings connected between said push-pull transistors and said bridge, an isolated negative feedback connection from a separate winding of said transformer to said amplifier, a resistive-capacitative quadrature phase shifter connected to another winding of said transformer, an automatic gain control rectifier-filter connected from still another winding of said transformer to the input circuit of said first transistor, an exclusively resistive network, said bridge and said phase-shifter connected in parallel between recited windings of said transformer and said network, an inductance-capacitance low pass filter approximately resonant to the frequency of oscillation of said oscillator to approximately quadrature shift the phase of the oscillations to an in-phase condition with respect to the phase of the signal at said first transistor, said filter connected between said resistive network and said first transistor; the recited connected elements composing a phase shift oscillator limited in amplitude of oscillation to a sine wave by automatic action of said gain control and coactive with said bridge such that the frequency of operation of said oscillator is altered as a linear function of a variation of an electrical parameter coherent with said bridge.

10. A frequency modulatable strain gage sine wave oscillator comprising three pairs of cascade-connected common-emitter transistors composing an amplifier having an output, the first transistor of the first pair having a separate electrode for automatic gain control, another pair of common-emitter transistors push-pull connected and cascade-connected to the output of said amplifier, a resistive bridge to originate the desired signal by resistance variation of at least one arm thereof, a transformer having plural windings, two of said transformer windings connecting said push-pull transistors and said bridge, a separate negative feedback connection from another winding of said transformer to said amplifier, a resistive-capacitative phase-shifter, said phase-shifter connected to still another winding of said transformer, an automatic gain control rectifier-filter connected from a still further winding of said transformer to said separate electrode of said first transistor, a resistive network, said bridge and said phase-shifter connected in parallel between recited plural windings of said transformer and said network, a low pass seriesed inductance-capacitance filter to alter the phase of the signal to an in-phase condition with respect to the phase of the oscillatory electrical energy to an in-phase condition with respect to the phase of the same at the junction of said push-pull transistors and the two said windings of said transformer, said low pass filter connected to said network and at the junction of said inductance and capacitance to the input of the first of said three pairs of said transistors; the recited connected elements composing a phase shift oscillator limited in amplitude of oscillation to a sine wave by said automatic gain control and said elements coactive with said bridge such that an unbalance of said bridge alters the frequency of operation of said oscillator as a linear function of said unbalance.

11. A frequency-modulatable voltage-controlled sine wave oscillator comprising plural pairs of cascade-connected common-emitter transistors composing an amplifier, the first transistor of the first pair having a base electrode for automatic gain control, another pair of common-emitter transistors push-pull connected and cascade-connected to said amplifier, a four diode bridge to short alternate half-cycles of oscillating energy in the presence of a modulating signal, a transformer having a primary and plural secondaries, said transformer primary connected to said push-pull transistors and a first secondary to said bridge, a separate negative feedback connection from a secondary of said transformer to said amplifier, a resistive-capacitative phase shifter, said phase-shifter connected to a third secondary of said transformer, an automatic gain control rectifier-filter connected from a fourth secondary of said transformer to said base electrode of said first transistor, a resistive network, means to impress said modulating signal upon said bridge and said network, said bridge and said phase-shifter connected in parallel between said first and said third secondaries of said transformer and said network, a low pass series connected inductance-capacitance filter to alter the phase of said oscillating energy to an in-phase condition with respect to the phase of the same at the junction of said push-pull transistors and the primary-first secondary of said transformer, the inductance of said low pass filter connected between said network and the input of the first of said plural pairs of said transistors and the capacitance in shunt thereto at said inductance; the recited connected elements composing a phase shift oscillator limited in oscillation amplitude to a sine wave by said automatic gain control and coactive with said diode bridge and said means to impress said modulating signal such that the frequency of operation of said oscillator is altered as a linear function of the amplitude of said modulating signal.

References Cited in the file of this patent

UNITED STATES PATENTS

| | | |
|---|---|---|
| 2,442,138 | Mann et al. | May 25, 1948 |
| 2,451,021 | Detuno | Oct. 12, 1948 |
| 2,504,050 | Rodke | Apr. 11, 1950 |
| 2,519,836 | Hurault | Aug. 22, 1950 |
| 2,566,405 | Lange et al. | Sept. 4, 1951 |
| 2,814,020 | Bouwman et al. | Nov. 19, 1957 |
| 2,923,893 | Runyan | Feb. 2, 1960 |

FOREIGN PATENTS

| | | |
|---|---|---|
| 1,013,330 | Germany | Aug. 8, 1957 |